(12) United States Patent
Murakami et al.

(10) Patent No.: US 7,355,411 B2
(45) Date of Patent: Apr. 8, 2008

(54) METHOD AND APPARATUS FOR ESTIMATING STATE OF CHARGE OF SECONDARY BATTERY

(75) Inventors: Yusai Murakami, Hamamatsu (JP); Norito Yamabe, Toyohashi (JP); Keiichi Minamiura, Ikoma-gun (JP); Tadao Kimura, Kobe (JP)

(73) Assignee: Panasonic EV Energy Co., Ltd., Shizuoka (JP)

( * ) Notice: Subject to any disclaimer, the term of this patent is extended or adjusted under 35 U.S.C. 154(b) by 233 days.

(21) Appl. No.: 10/953,013

(22) Filed: Sep. 29, 2004

(65) Prior Publication Data

US 2005/0073315 A1    Apr. 7, 2005

(30) Foreign Application Priority Data

Oct. 1, 2003    (JP)    ............................. 2003-343597

(51) Int. Cl.
    *G01N 27/416*    (2006.01)
    *H02J 7/00*    (2006.01)
(52) U.S. Cl. ...................... 324/427; 320/107
(58) Field of Classification Search ................ 324/427, 324/429; 320/107; 426/436
    See application file for complete search history.

(56) References Cited

U.S. PATENT DOCUMENTS 6,417,668 B1 * 7/2002 Howard et al. ............. 324/426
2002/0030494 A1 * 3/2002 Araki et al. ................ 324/427
2004/0257087 A1 * 12/2004 Murakami .................. 324/426

FOREIGN PATENT DOCUMENTS

JP    2002-365347    12/2002
JP    2003-197275    7/2003

* cited by examiner

*Primary Examiner*—Bao Q. Vu
*Assistant Examiner*—Yalkew Fantu
(74) *Attorney, Agent, or Firm*—Workman Nydegger

(57) ABSTRACT

When a power switch portion 10 is in an open state and a charge/discharge path of the secondary battery 100 is in a disconnected state, an electromotive force calculation portion 109 calculates a battery electromotive force Veq by subtracting a polarized voltage Vpol stored in a polarized voltage storage portion 113 from an open-circuit voltage OCV measured by a voltage measurement portion 102. Based on the electromotive force, a state-of-charge estimation portion 110 estimates a state of charge SOC. Thus, a polarized voltage to be considered for the estimation of SOC can be limited. The state of charge (SOC) of a secondary battery can be estimated with high accuracy and quickly.

20 Claims, 2 Drawing Sheets

METHOD AND APPARATUS FOR ESTIMATING STATE OF CHARGE OF SECONDARY BATTERY

BACKGROUND OF THE INVENTION

1. Field of the Invention

The present invention relates to a method for estimating a state of charge (SOC) of a secondary battery, such as a nickel-metal hydride (Ni—MH) battery or the like, that is installed in a pure electric vehicle (PEV), a hybrid electric vehicle (HEV) or the like as a power source for a motor and a drive source for various loads.

2. Description of the Related Art

Conventionally, in an HEV, when the output of its engine is higher than the required power for driving, a generator is driven with the surplus power to charge a secondary battery. On the contrary, when the output of the engine is lower than the required power, a motor is driven with the electric power of the secondary battery to output power to cover the shortage of the required power. In this case, the secondary battery is discharged. Therefore, when a secondary battery is mounted into an HEV or the like, it is necessary to control the charge and discharge of the secondary battery to maintain an appropriate driving state of the vehicle.

To achieve this, the state of charge (hereinafter referred to as SOC) of the secondary battery is estimated by calculation based on the detected battery voltage, current, temperature, and the like, and the SOC is controlled so that the fuel consumption efficiency of the vehicle is maximized. In this case, the SOC level generally is controlled to fall within the range of, for example, 50% to 70% in order to optimize the balance between power assist by motor drive during acceleration and energy regeneration during deceleration (regenerative control). Specifically, when the SOC is lowered to, for example, 50%, charge is predominantly performed. Conversely, when the SOC is increased to, for example, 70%, discharge is predominantly performed. As a result, the SOC is controlled to be within the range mentioned above.

In order to accurately perform such SOC control, it is necessary to accurately estimate the SOC of secondary battery that is being charged/discharged. There is the following known conventional method for estimating SOC from battery voltage.

Initially, a plurality of sets of pair data of a voltage V and a charged/discharged current I are obtained and stored over a predetermined period of time. The pair data is used to perform regression analysis to obtain an approximate first-order straight line (voltage V-current I approximate straight line). The V intercept of the V-I approximate straight line is obtained as a battery voltage V0 (no-load voltage). In addition, an integrated value $\int I$ of the current I is calculated; a polarized voltage Vp of a battery is obtained using a function of a temperature T, the battery voltage V0 and the current integrated value $\int I$; and an electromotive force E of the battery is obtained by subtracting polarized voltage Vp from battery voltage V0. Next, an SOC is estimated from the obtained electromotive force E with reference to previously prepared electromotive force-SOC characteristics.

When an SOC is estimated from voltage in the above-described manner and a possible input/output voltage during a predetermined period of time is calculated, it is necessary to estimate the polarized voltage accurately, or eliminate the influence of polarized voltage. A battery voltage is increased during charge and is decreased during discharge, and the difference therebetween is referred to as a polarized voltage.

The influence of polarized voltage is eliminated, for example, as follows. After the charge and discharge of a battery is stopped, the duration of the stopped state is measured. When the duration reaches a given time, at which an open-circuit voltage can be considered to be equal to a voltage corresponding to the actual charged state of the battery, immediately before the start of charge and discharge of the battery by switching on an ignition, the open-circuit voltage of the battery is detected based on an output signal output by a voltage sensor. Based on the detected open-circuit voltage, an SOC is determined (see, for example, JP 2002-365347A).

However, the above-described conventional SOC estimation technique has the following problems.

It is difficult to estimate a polarized voltage accurately. Therefore, when an SOC is estimated based on a battery voltage measured during driving a vehicle as in a technique disclosed in JP 2003-197275A, the resultant SOC contains a number of errors, i.e., the SOC cannot be estimated with high accuracy. In the technique of JP 2002-365347A, it takes a long time (e.g., about one month) to wait until the influence of polarized voltage occurring when a battery is charged and discharged is completely eliminated. Therefore, this technique is not sufficiently practicable.

SUMMARY OF THE INVENTION

Thus, an object of the present invention is to provide a method and apparatus capable of estimating the state of charge (SOC), i.e., the charged state, of a secondary battery with high accuracy and quickly.

In order to achieve the above-described object, a first method for estimating a state of charge (SOC) of a secondary battery of the present invention includes the steps of: measuring an open-circuit voltage (OCV) of the secondary battery when a charge/discharge path of the secondary battery is in a disconnected state; storing a polarized voltage (Vpol) of the secondary battery; calculating an electromotive force (Veq) of the secondary battery by subtracting the stored polarized voltage from the measured open-circuit voltage; and estimating the state of charge of the secondary battery based on the calculated electromotive force.

With the first method, a polarized voltage to be considered is limited by measuring the open-circuit voltage of a secondary battery in the disconnected state of the charge/discharge path, which makes it possible to estimate the SOC with high accuracy and quickly. As a result, protection control of a battery and extension of battery life can be achieved based on the SOC estimated with high accuracy.

In order to achieve the above-described object, a second method for estimating a state of charge of a secondary battery of the present invention is provided in which the secondary battery is used in an intermediately charged state (e.g., in the SOC range of 50% to 70%) as a power source for a motor and a drive source for a load. The second method includes the steps of measuring an open-circuit voltage (OCV) of the secondary battery when a charge/discharge path of the secondary battery is in a disconnected state; storing a polarized voltage (Vpol) of the secondary battery; calculating an electromotive force (Veq) of the secondary battery by subtracting the stored polarized voltage from the measured open-circuit voltage; and calculating the state of charge of the secondary battery based on the calculated electromotive force.

With the second method, a polarized voltage to be considered is limited by measuring the open-circuit voltage of a secondary battery installed in a vehicle when a control state signal (SWS) of a power switch for switching the charge/discharge path of the secondary battery into the disconnected state or the connected state indicates the disconnected state, which makes it possible to estimate the SOC with high accuracy and quickly. As a result, protection control of a battery and extension of battery life can be achieved based on the SOC estimated with high accuracy.

The first and second method each further includes determining whether or not the charge/discharge path is in the disconnected state; and measuring a terminal voltage of the secondary battery as the open-circuit voltage when it is determined in the determining step that the charge/discharge path is in the disconnected state.

In this case, it is preferable that the first and second method each further includes measuring a current (I(n)) flowing through the secondary battery, and in the determining step, it is determined based on a value of the measured current whether or not the charge/discharge path is in the disconnected state. Specifically, when a control signal (SWC) for controlling the switching of the power switch for the secondary battery indicates the open state of the power switch and the value of the current I(n) measured for a predetermined period of time is close to zero, it is determined that the charge/discharge path is in the disconnected state.

Alternatively, the first and second method each further includes measuring a current (I(n)) flowing through the secondary battery; calculating a charge/discharge amount (ΔQ) of the secondary battery based on the measured current; and calculating the polarized voltage (Vpol) based on the calculated charge/discharge amount.

In this case, it is preferable that in the polarized voltage calculating step, the polarized voltage is calculated based on a look-up table or an expression that stores characteristics of the polarized voltage (Vpol) versus the charge/discharge amount (ΔQ) where a temperature (T(n)) is a parameter, the characteristics being previously obtained.

In addition, in the first and second methods, it is preferable that in the state-of-charge estimating step, the state of charge is estimated based on a look-up table or an expression that stores characteristics of the state of charge (SOC) versus the electromotive force (Veq) where a temperature (T(n)) is a parameter, the characteristics being previously obtained.

In order to achieve the above-described object, a first apparatus for estimating a state of charge (SOC) of a secondary battery of the present invention includes: a voltage measurement portion for measuring an open-circuit voltage (OCV) of the secondary battery when a charge/discharge path of the secondary battery is in a disconnected state; a polarized voltage storage portion for storing a polarized voltage (Vpol) of the secondary battery; an electromotive force calculation portion for calculating an electromotive force (Veq) of the secondary battery by subtracting the polarized voltage stored in the polarized voltage storage portion from the open-circuit voltage measured by the voltage measurement portion; and a state-of-charge estimation portion for estimating the state of charge (SOC) of the secondary battery based on the electromotive force from the electromotive force calculation portion.

With the first apparatus, a polarized voltage to be considered is limited by measuring the open-circuit voltage OCV of a secondary battery in the disconnected state of the charge/discharge path, which makes it possible to estimate the SOC with high accuracy and quickly. As a result, protection control of a battery and extension of battery life can be achieved based on the SOC estimated with high accuracy.

In order to achieve the above-described object, a second apparatus for estimating a state of charge of a secondary battery of the present invention is provided, in which the secondary battery is used in an intermediately charged state (e.g., in the SOC range of 50% to 70%) as a power source for a motor and a drive source for a load. The second apparatus includes: a voltage measurement portion for measuring an open-circuit voltage (OCV) of the secondary battery when a charge/discharge path of the secondary battery is in a disconnected state; a polarized voltage storage portion for storing a polarized voltage (Vpol) of the secondary battery; an electromotive force calculation portion for calculating an electromotive force (Veq) of the secondary battery by subtracting the polarized voltage stored in the polarized voltage storage portion from the open-circuit voltage measured by the voltage measurement portion; and a state-of-charge estimation portion for estimating the state of charge (SOC) of the secondary battery based on the electromotive force from the electromotive force calculation portion.

With the second apparatus, a polarized voltage to be considered is limited by measuring the open-circuit voltage OCV of a secondary battery installed in a vehicle when a control state signal (SWS) for switching the charge/discharge path of the secondary battery into the disconnected state or the connected state indicates the disconnected state, which makes it possible to estimate the SOC with high accuracy and quickly. As a result, protection control of a battery and extension of battery life can be achieved based on the SOC estimated with high accuracy.

The first and second apparatus each further includes a disconnected state determination portion for determining whether or not the charge/discharge path is in the disconnected state. When it is determined by the disconnected state determination portion that the charge/discharge path is in the disconnected state, a terminal voltage (V(n)) of the secondary battery is measured by the voltage measurement portion as the open-circuit voltage (OCV).

In this case, it is preferable that the first and second method each further includes a current measurement portion for measuring a current (I(n)) flowing through the secondary battery, and the disconnected state determination portion determines, based on a value of the current measured by the current measurement portion, whether or not the charge/discharge path is in the disconnected state. Specifically, when a control signal (SWC) for controlling the switching of the power switch for the secondary battery indicates the open state of the power switch and the value of the current I(n) measured for a predetermined period of time is close to zero, the disconnected state determination portion determines that the charge/discharge path is in the disconnected state.

Alternatively, the first and second apparatus each further includes a current measurement portion for measuring a current (I(n)) flowing through the secondary battery; a charge/discharge amount calculation portion for calculating a charge/discharge amount (ΔQ) of the secondary battery based on the current measured by the current measurement portion; and a polarized voltage calculation portion for calculating the polarized voltage (Vpol) based on the charge/discharge amount calculated by the charge/discharge amount calculation portion.

In this case, it is preferable that the first and second apparatus each further includes a temperature measurement portion for measuring a temperature (T(n)) of the second battery. Also, it is preferable that the polarized voltage calculation portion calculates the polarized voltage based on a look-up table or an expression that stores characteristics of the polarized voltage (Vpol) versus the charge/discharge amount ($\Delta Q$) where a temperature (T(n)) is a parameter, the characteristics being previously obtained.

Furthermore, it is preferable that the first and second apparatus each further includes a temperature measurement portion for measuring a temperature (T(n)) of the second battery. Also, it is preferable that the state-of-charge estimation portion estimates the state of charge based on a look-up table or an expression that stores characteristics of the state of charge (SOC) versus the electromotive force (Veq) where the temperature (T(n)) is a parameter, the characteristics being previously obtained.

DESCRIPTION OF THE PREFERRED EMBODIMENTS

Hereinafter, preferred embodiments of the present invention will be described with reference to the accompanying drawings.

Figure 1:
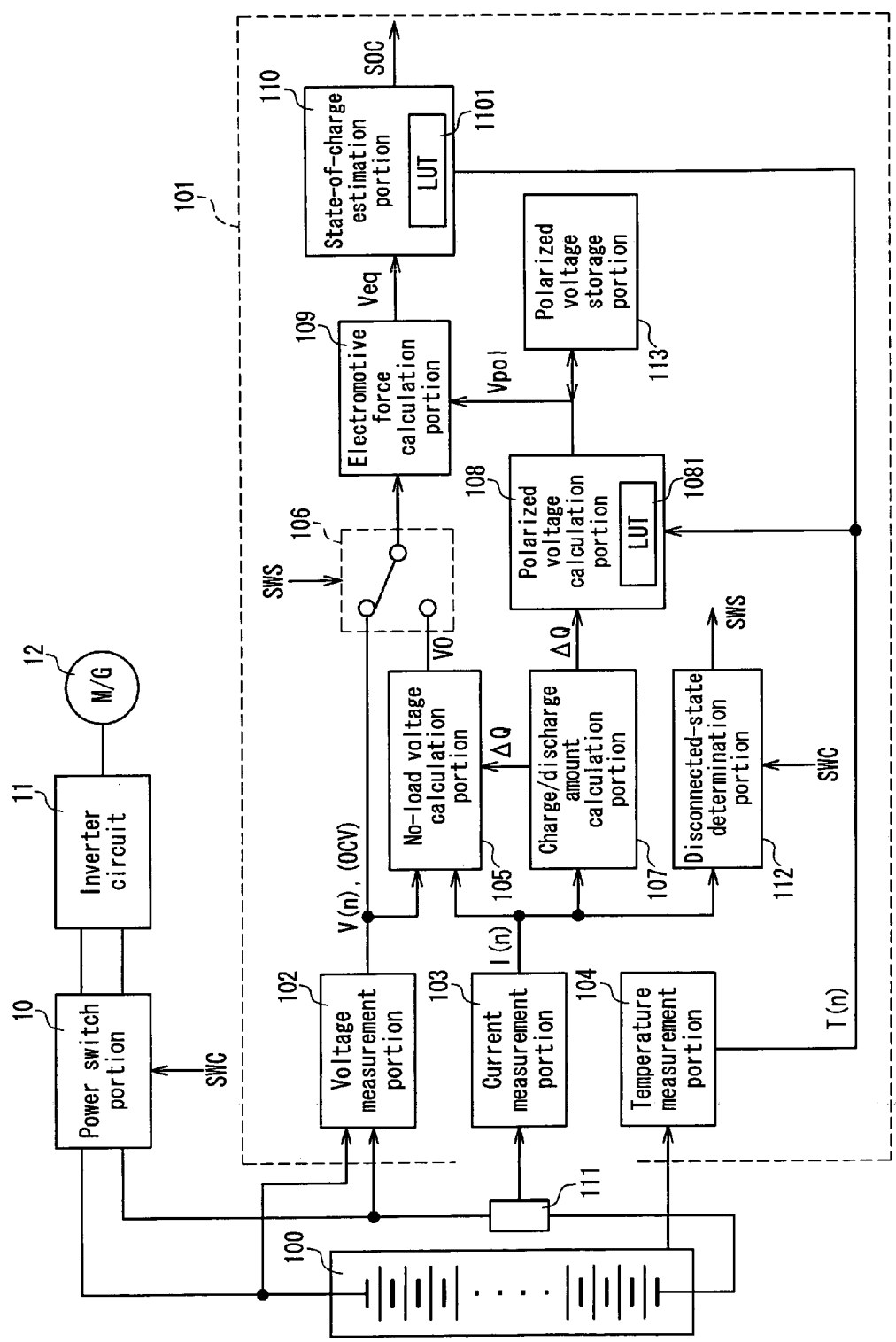
FIG. 1 is a block diagram showing an example of a configuration of a battery pack system comprising an apparatus for estimating a state of charge of a secondary battery according to an embodiment of the present invention and a high voltage circuit portion that is a part of an HEV.

FIG. 1 is a block diagram showing an exemplary configuration of a battery pack system comprising an apparatus for estimating a state of charge of a secondary battery according to an embodiment of the present invention and a high voltage circuit portion that is a part of an HEV. In FIG. 1, the battery pack system includes a secondary battery 100 composed of a single cell or a combination of a plurality of unit cells, and a battery electric control unit (hereinafter abbreviated as battery ECU) 101 including a state-of-charge estimation apparatus according to the present invention as a portion of a microcomputer system.

The high voltage circuit portion includes a power switch portion 10, an inverter circuit 11, and a motor/generator (hereinafter abbreviated as M/G) 12. The power switch portion 10 is switched on/off based on a control signal SWC. When a control state signal SWS (described below) of the power switch portion 10 is in an inactivated state, the power switch portion 10 is in an open state, i.e., a charge/discharge path of the secondary battery 100 is disconnected. When the control state signal SWS is in an activated state, the power switch portion 10 is in a closed state, i.e., the charge/discharge path of the secondary battery 100 is in a connected state.

The inverter circuit 11 converts a direct current electric power from the secondary battery 100 into an alternating current electric power when discharging the secondary battery 100 during accelerating, climbing a slope, or the like, and supplies the alternating current electric power to the M/G 12 to cause the M/G 12 to serves as a motor. The inverter circuit 11 also converts an alternating current electric power from the M/G 12 serving as a generator into a direct current electric power when charging the secondary battery 100 during regenerative control or the like, and supplies the direct current electric power to the secondary battery 100.

In the battery ECU 101, reference numeral 102 denotes a voltage measurement portion that measures and samples a terminal voltage of the secondary battery 100 detected with a voltage sensor (not shown) in predetermined intervals when the power switch portion 10 is in the open state. The resultant sampling data is referred to as voltage data V(n), which represents an open-circuit voltage OCV. Reference numeral 103 denotes a current measurement portion that measures and samples a charge/discharge current of the secondary battery 100 detected with a current sensor 111 in predetermined intervals when the power switch portion 10 in the closed state so that the secondary battery 100 is charged and discharged. The resultant sampling data is referred to as current data I(n), (the sign of which represents a charge direction or a discharge direction). Reference numeral 104 denotes a temperature measurement portion that measures a temperature of the secondary battery 100 using a temperature sensor (not shown). The resultant data is referred to as temperature data T(n).

When the power switch portion 10 is in the closed state, the voltage data V(n) from the voltage measurement portion 102 and the current data I(n) from the current measurement portion 103 are supplied as pair data to a no-load voltage calculation portion 105. When the power switch portion 10 is in the closed state, and charge and discharge are performed for the secondary battery 100, the no-load voltage calculation portion 105 determines that the pair data of the voltage data V(n) and the current data I(n) are effective if satisfying the following specific selection conditions: the values of the current data I(n) are within a predetermined range in the charge direction (−) and the discharge direction (+) (e.g., ±50 A); the number of values of the current data I(n) is equal to or greater than a predetermined number in each of the charge direction and the discharge direction (e.g., 10 of 60 samples for each direction); and a charge/discharge amount $\Delta Q$ (described below) is within a predetermined range (e.g., 0.3 Ah) during obtaining of the pair data.

Next, the no-load voltage calculation portion 105 uses the effective pair data to obtain a first-order voltage-current straight line (approximate straight line) by statistical processing using the least squares method. Based on the approximate straight line, the no-load voltage calculation portion 105 calculates a no-load voltage V0 that is a voltage value (voltage intercept) when the current is zero.

Reference numeral 106 denotes a switching means. When the charge/discharge path of the secondary battery 100 is in a disconnected state, the switching means 106 selects and outputs voltage data V(n) from the voltage measurement portion 102 as an open-circuit voltage OCV. On the other hand, when the charge/discharge path of the secondary battery 100 is in the connected state, the switching means 106 selects and outputs a no-load voltage V0 from the no-load voltage calculation portion 105. The switching of the switching means 106 is controlled based on the control state signal SWS indicating whether the charge/discharge path of the secondary battery 100 is in the disconnected state or in the connected state when the power switch portion 10 is switched to the open state or the closed state based on the control signal SWC.

Current data I(n) is supplied from the current measurement portion 103 to a charge/discharge amount calculation portion 107, which in turn calculates the charge/discharge amount $\Delta Q$ of the secondary battery 100 during a predetermined period of time (e.g., one minute). The charge/discharge amount $\Delta Q$ is supplied as a specific selection condition to the no-load voltage calculation portion 105 and also a polarized voltage calculation portion 108.

The polarized voltage calculation portion 108 contains a look-up table (LUT) 1081 that previously stores a characteristic curve or an expression of polarized voltage Vpol versus the charge/discharge amount ΔQ where a temperature is a parameter. The polarized voltage calculation portion 108 calculates a polarized voltage Vpol based on temperature data T(n) obtained by the temperature measurement portion 104 with reference to the look-up table (LUT) 1081. For example, in the case of an HEV application, a characteristic curve capable of covering a temperature range of −30° C. to +60° C. is stored as reference data in the LUT 1081. The polarized voltage Vpol calculated by the polarized voltage calculation portion 108 is stored in a polarized voltage storage portion 113.

In addition, the open-circuit voltage OCV or the no-load voltage V0 from the switching means 106, and the polarized voltage Vpol calculated by the polarized voltage calculation portion 108 or the polarized voltage Vpol stored in and read out from the polarized voltage storage portion 113, are supplied to an electromotive force calculation portion 109. The electromotive force calculation portion 109 subtracts the polarized voltage Vpol from the open-circuit voltage OCV or the no-load voltage V0 to calculate an electromotive force Veq (equilibrium potential). The thus-calculated electromotive force Veq is input to a state-of-charge estimation portion 110. The state-of-charge estimation portion 110 contains a look-up table (LUT) 1101 that previously stores a characteristic curve or an expression of the electromotive force Veq versus the state of charge SOC where a temperature is a parameter. The state-of-charge estimation portion 110 estimates the state of charge SOC based on temperature data T(n) obtained by the temperature measurement portion 104 with reference to the look-up table (LUT) 1101. For example, in the case of an HEV application, a characteristic curve capable of covering a temperature range of −30° C. to +60° C. is stored as reference data in the LUT 1101.

The current data I(n) is supplied from the current measurement portion 103 to a disconnected-state determination portion 112. The disconnected-state determination portion 112 determines that the charge/discharge path of the secondary battery 100 is in the disconnected state, when the control signal SWC for controlling the switching of the power switch portion 10 denotes an open state and the values of the current data I(n) obtained during the predetermined period of time are close to zero. In this case, the disconnected-state determination portion 112 outputs a control state signal SWS indicating the disconnected state (i.e., the control state signal SWS is turned into an inactivated state).

Next, a procedure for estimating the state-of-charge of the above-described battery pack system will be described with reference to FIG.

Figure 2:
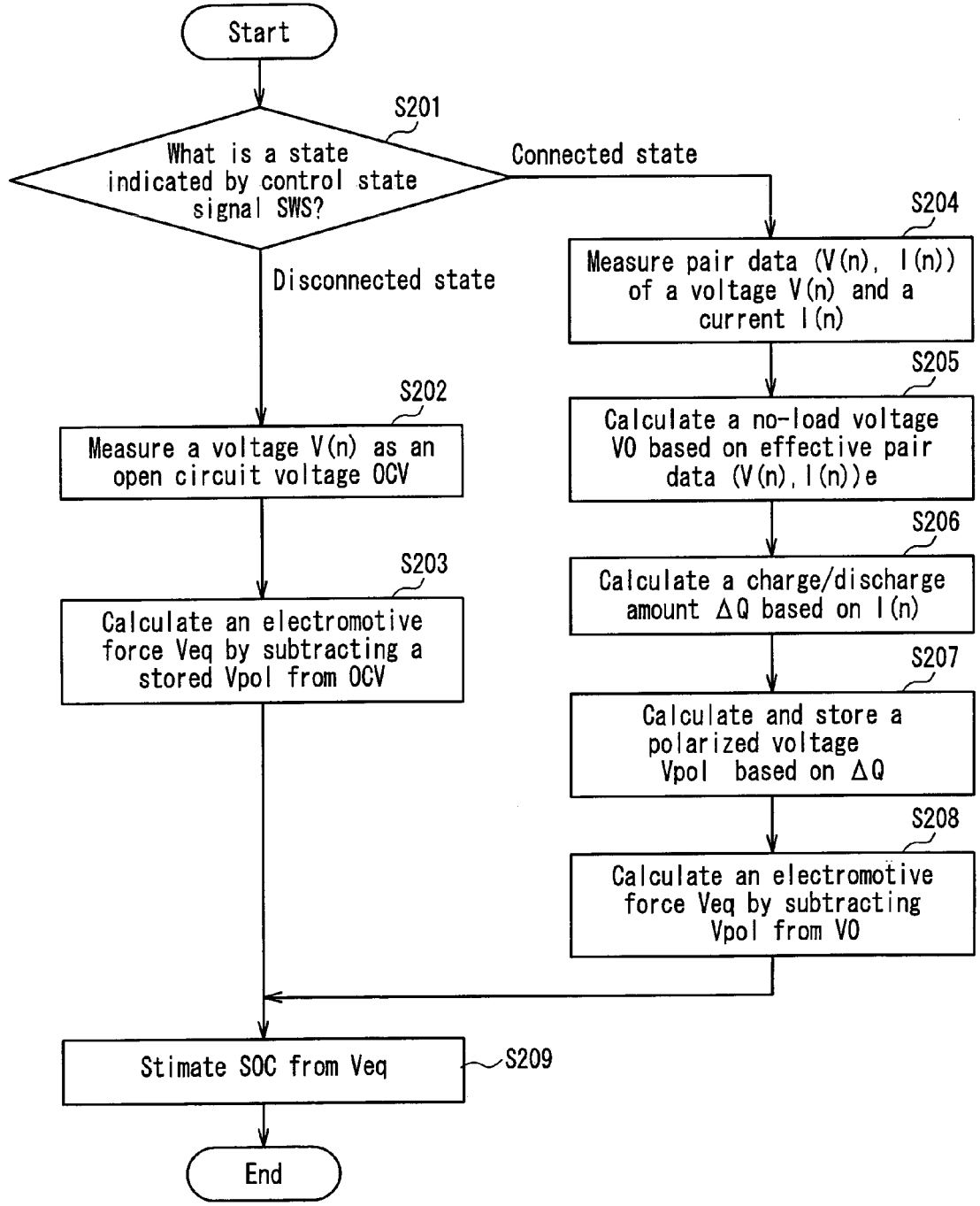
FIG. 2 is a flowchart showing a procedure of a method for estimating a state of charge of a secondary battery according to an embodiment of the present invention.

FIG. 2 is a flowchart showing a procedure of a method for estimating a state of charge of a secondary battery according to an embodiment of the present invention.

In FIG. 2, initially, it is determined whether a state indicated by the control state signal SWS is the disconnected state or the connected state of the charge/discharge path (step S201). When the state indicated by the control state signal SWS is the disconnected state, the power switch portion 10 is in the open state due to the control signal SWC, and voltage data V(n) is obtained as an open-circuit voltage OCV by the voltage measurement portion 102 (step S202). Thereafter, a polarized voltage Vpol stored in the polarized voltage storage portion 108 is subtracted from the open-circuit voltage OCV obtained in step S202 to calculate an electromotive force Veq (step S203).

On the other hand, when it is determined in step S201 that the state indicated by the control state signal SWS is the connected state of the charge/discharge path, the power switch portion 10 is in the closed state due to the control signal SWC. In this case, when the secondary battery 100 is being charged and discharged, voltage data V(n) and current data I(n) are obtained as pair data (V(n), I(n)) (step S204). Next, when the pair data (V(n), I(n)) of the voltage data V(n) and the current data I(n) obtained in step S204 satisfies the above-described specific selection conditions, a plurality of pieces (e.g., 10 of 60 samples for each of the charge and discharge directions) of effective pair data (V(n), I(n))e are obtained. Based on the effective pair data (V(n), I(n))e, statistical processing is performed using the least squares method to obtain a first-order approximate straight line (V-I straight line). Thereafter, the V intercept of the approximate straight line is calculated as a no-load voltage V0 (step S205).

Next, based on the current data I(n) obtained by the current measurement portion 103, a charge/discharge amount ΔQ of the secondary battery 100 during a predetermined period of time (e.g., one minute) is calculated (step S206). Based on the thus-obtained charge/discharge amount ΔQ, a polarized voltage Vpol is calculated with reference to the LUT 1081 that previously stores the charge/discharge amount ΔQ-polarized voltage Vpol characteristics data where temperature data T(n) is a parameter. The polarized voltage Vpol is stored in the polarized voltage storage portion 113 (step S207).

After the polarized voltage Vpol is calculated as described above, the polarized voltage Vpol then is subtracted from the no-load voltage V0 obtained in step S205 to calculate an electromotive force Veq of the secondary battery 100 (step S208).

Next, based on the electromotive force Veq obtained in step S203 or S208, the state of charge SOC is estimated with reference to the LUT 1101 that previously stores the electromotive force Veq-state of charge SOC characteristics data where temperature data T(n) is a parameter (step S209).

As described above, the SOC is estimated.

According to the method and apparatus for estimating the state-of-charge of a secondary battery of the present invention, an open-circuit voltage is measured when a control state signal of a power switch for switching the charge/discharge path of the secondary battery into the disconnected state or the connected state indicates the disconnected state, and thus a polarized voltage to be considered is limited. As a result, the SOC can be estimated with high accuracy and quickly. With the SOC estimated with high accuracy, it is possible to achieve the protection control of a battery and the extension of battery life. Therefore, the present invention is particularly useful for electric vehicle applications that require high-accuracy estimation of the state of charge, such as a pure electric vehicle (PEV), a hybrid electric vehicle (HEV), a hybrid vehicle having a fuel battery and a secondary battery, and the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for estimating a state of charge of a secondary battery, comprising the steps of:
    preparing a switch in a charge/discharge path of the secondary battery; turning on the switch to connect the charge/discharge path of the secondary battery;
    calculating a no-load voltage of the secondary battery when the charge/discharge path of the secondary battery is in a connected state;
    turning off the switch to disconnect the charge/discharge path of the secondary battery;
    measuring an open-circuit voltage of the secondary battery when the charge/discharge path of the secondary battery is in a disconnected state;
    storing a polarized voltage of the secondary battery;
    calculating an electromotive force of the secondary battery by subtracting the stored polarized voltage from one of the calculated no-load voltage and the measured open-circuit voltage; and
    estimating the state of charge of the secondary battery based on the calculated electromotive force.

2. A method for estimating a state of charge of a secondary battery, wherein the secondary battery is used in an intermediately charged state as a power source for a motor and a drive source for a load, the method comprising the steps of:
    preparing a switch in a charge/discharge path of the secondary battery;
    turning on the switch to connect the charge/discharge path of the secondary battery;
    calculating a no-load voltage of the secondary battery when the charge/discharge path of the secondary battery is in a connected state;
    turning off the switch to disconnect the charge/discharge path of the secondary battery;
    measuring an open-circuit voltage of the secondary battery when the charge/discharge path of the secondary battery is in a disconnected state;
    storing a polarized voltage of the secondary battery;
    calculating an electromotive force of the secondary battery by subtracting the stored polarized voltage from one of the calculated no-load voltage and the measured open-circuit voltage; and
    calculating the state of charge of the secondary battery based on the calculated electromotive force.

3. The method according to claim 1, further comprising:
    determining whether or not the charge/discharge path is in the disconnected state; and
    measuring a terminal voltage of the secondary battery as the open-circuit voltage when it is determined in the determining step that the charge/discharge path is in the disconnected state.

4. The method according to claim 3, further comprising:
    measuring a current flowing through the secondary battery, wherein in the determining step, it is determined based on a value of the measured current whether or not the charge/discharge path is in the disconnected state.

5. The method according to claim 1, further comprising:
    measuring a current flowing through the secondary battery;
    calculating a charge/discharge amount of the secondary battery based on the measured current; and
    calculating the polarized voltage based on the calculated charge/discharge amount.

6. The method according to claim 5, wherein in the polarized voltage calculating step, the polarized voltage is calculated based on a look-up table or an expression that stores characteristics of the polarized voltage versus the charge/discharge amount where a temperature is a parameter, the characteristics being previously obtained.

7. The method according to claim 1, wherein in the state-of-charge estimating step, the state of charge is estimated based on a look-up table or an expression that stores characteristics of the state of charge versus the electromotive force where a temperature is a parameter, the characteristics being previously obtained.

8. An apparatus for estimating a state of charge of a secondary battery, comprising:
    a switch provided in a charge/discharge path of the secondary battery;
    a voltage measurement portion for turning off the switch to disconnect the charge/discharge path of the secondary battery and measuring an open circuit voltage of the secondary battery when the charge/discharge path of the secondary battery is in a disconnected state;
    a no-load voltage calculation portion for calculating a no-load voltage of the secondary battery when the switch is turned on and the charge/discharge path of the secondary battery is in a connected state:
    a polarized voltage storage portion for storing a polarized voltage of the secondary battery;
    an electromotive force calculation portion for calculating an electromotive force of the secondary battery by subtracting the polarized voltage stored in the polarized voltage storage portion from one of the no-load voltage calculated by the no-load voltage calculation portion and the open-circuit voltage measured by the voltage measurement portion; and
    a state-of-charge estimation portion for estimating the state of charge of the secondary battery based on the electromotive force from the electromotive force calculation portion.

9. An apparatus for estimating a state of charge of a secondary battery, wherein the secondary battery is used in an intermediately charged state as a power source for a motor and a drive source for a load, the apparatus comprising:
    a switch provided in a charge/discharge path of the secondary battery;
    a voltage measurement portion for turning off the switch to disconnect the charge/discharge path of the secondary battery and measuring an open circuit voltage of the secondary battery when the charge/discharge path of the secondary battery is in a disconnected state;
    a no-load voltage calculation portion for calculating a no-load voltage of the secondary battery when the switch is turned on and the charge/discharge path of the secondary battery is in a connected state;
    a polarized voltage storage portion for storing a polarized voltage of the secondary battery;
    an electromotive force calculation portion for calculating an electromotive force of the secondary battery by subtracting the polarized voltage stored in the polarized voltage storage portion from one of the no-load voltage calculated by the no-load voltage calculation portion and the open-circuit voltage measured by the voltage measurement portion; and
    a state-of-charge estimation portion for estimating the state of charge of the secondary battery based on the electromotive force from the electromotive force calculation portion.

10. The apparatus according to claim 8, further comprising:
    a disconnected state determination portion for determining whether or not the charge/discharge path is in the disconnected state, wherein a terminal voltage of the secondary battery measured by the voltage measurement portion is used as the open-circuit voltage when it is determined by the disconnected state determination portion that the charge/discharge path is in the disconnected state.

11. The apparatus according to claim 10, further comprising:
a current measurement portion for measuring a current flowing through the secondary battery, wherein the disconnected state determination portion determines based on a value of the current measured by the current measurement portion whether or not the charge/discharge path is in the disconnected state.

12. The apparatus according to claim 8, further comprising:
a current measurement portion for measuring a current flowing through the secondary battery;
a charge/discharge amount calculation portion for calculating a charge/discharge amount of the secondary battery based on the current measured by the current measurement portion; and
a polarized voltage calculation portion for calculating the polarized voltage based on the charge/discharge amount calculated by the charge/discharge amount calculation portion.

13. The apparatus according to claim 12, further comprising:
a temperature measurement portion for measuring a temperature of the secondary battery, wherein the polarized voltage calculation portion calculates the polarized voltage based on the temperature measured by the temperature measurement portion and a look-up table or an expression that stores characteristics of the polarized voltage versus the charge/discharge amount where the temperature is a parameter, the characteristics being previously obtained.

14. The apparatus according to claim 8, further comprising:
a temperature measurement portion for measuring a temperature of the secondary battery, wherein the state-of-charge estimation portion estimates the state of charge based on the temperature measured by the temperature measurement portion and a look-up table or an expression that stores characteristics of the state of charge versus the electromotive force where the temperature is a parameter, the characteristics being previously obtained.

15. The method according to claim 2, further comprising:
determining whether or not the charge/discharge path is in the disconnected state; and
measuring a terminal voltage of the secondary battery as the open-circuit voltage when it is determined in the determining step that the charge/discharge path is in the disconnected state.

16. The method according to claim 2, further comprising:
measuring a current flowing through the secondary battery;
calculating a charge/discharge amount of the secondary battery based on the measured current; and
calculating the polarized voltage based on the calculated charge/discharge amount.

17. The method according to claim 2, wherein in the state-of-charge estimating step, the state of charge is estimated based on a look-up table or an expression that stores characteristics of the state of charge versus the electromotive force where a temperature is a parameter, the characteristics being previously obtained.

18. The apparatus according to claim 9, further comprising:
a disconnected state determination portion for determining whether or not the charge/discharge path is in the disconnected state, wherein a terminal voltage of the secondary battery measured by the voltage measurement portion is used as the open-circuit voltage when it is determined by the disconnected state determination portion that the charge/discharge path is in the disconnected state.

19. The apparatus according to claim 9, further comprising:
a current measurement portion for measuring a current flowing through the secondary battery;
a charge/discharge amount calculation portion for calculating a charge/discharge amount of the secondary battery based on the current measured by the current measurement portion; and
a polarized voltage calculation portion for calculating the polarized voltage based on the charge/discharge amount calculated by the charge/discharge amount calculation portion.

20. The apparatus according to claim 9, further comprising:
a temperature measurement portion for measuring a temperature of the secondary battery, wherein the state-of-charge estimation portion estimates the state of charge based on the temperature measured by the temperature measurement portion and a look-up table or an expression that stores characteristics of the state of charge versus the electromotive force where the temperature is a parameter, the characteristics being previously obtained.

* * * * *